United States Patent
Carter et al.

(10) Patent No.: US 6,177,360 B1
(45) Date of Patent: Jan. 23, 2001

(54) PROCESS FOR MANUFACTURE OF INTEGRATED CIRCUIT DEVICE

(75) Inventors: Kenneth Raymond Carter, San Jose, CA (US); Robert Frances Cook, Putnam Valley, NY (US); Martha Alyne Harbison, Sacramento, CA (US); Craig Jon Hawker, Los Gatos, CA (US); James Lupton Hedrick, Pleasanton, CA (US); Victor Yee-Way Lee, San Jose, CA (US); Eric Gerhard Liniger, Danbury, CT (US); Robert Dennis Miller; Willi Volksen, both of San Jose, CA (US); Do Yeung Yoon, Los Gatos, CA (US)

(73) Assignee: International Business Machines Corporation, Armonk, NY (US)

( * ) Notice: Under 35 U.S.C. 154(b), the term of this patent shall be extended for 0 days.

(21) Appl. No.: 08/965,384

(22) Filed: Nov. 6, 1997

(51) Int. Cl.[7] .................................................. H01L 21/31
(52) U.S. Cl. ..................... 438/781; 438/624; 438/633; 438/697; 438/701
(58) Field of Search ..................... 438/624, 631, 438/633, 637, 780, 781, 782, 700, 703, 697, 701

(56) References Cited

U.S. PATENT DOCUMENTS

| | | | |
|---|---|---|---|
| 4,520,041 | * 5/1985 | Aoyama et al. | 427/88 |
| 4,626,556 | 12/1986 | Nozue et al. | 522/99 |
| 5,206,117 | * 4/1993 | Labadie et al. | 430/325 |
| 5,767,014 | * 6/1998 | Hawker et al. | 438/623 |
| 5,789,460 | * 6/1998 | Harkness et al. | 522/148 |
| 5,861,235 | * 1/1999 | Harkness et al. | 430/325 |
| 5,895,263 | * 4/1999 | Carter et al. | 438/624 |
| 5,915,203 | * 6/1999 | Sengupta et al. | 438/669 |

OTHER PUBLICATIONS

D. Loy et al., "Bridged Polysilsesquioxanes. High Porous Organic–Inorganic Materials", Chem. Rev. 19955, 95, 1431–1442.

R. Baney et al., "Silsesquioxanes", Chem. Rev. 1995, 1409–1430.

* cited by examiner

*Primary Examiner*—Matthew Smith
*Assistant Examiner*—Renzo N. Rocchegiani
(74) *Attorney, Agent, or Firm*—Scully, Scott, Murphy & Presser; Daniel P. Morris

(57) ABSTRACT

The invention relates to a process for making an integrated circuit device comprising (i) a substrate, (ii) metallic circuit lines positioned on the substrate, and (iii) a dielectric material positioned on the circuit lines. The dielectric material comprises the condensation product of silsesquioxane in the presence of a photosensitive or thermally sensitive base generator.

17 Claims, 2 Drawing Sheets

PROCESS FOR MANUFACTURE OF INTEGRATED CIRCUIT DEVICE

FIELD OF THE INVENTION

The present invention relates to an improved dielectric composition for use in the manufacture of integrated circuit devices and to the process for the manufacture of dielectric layers in integrated circuit devices.

BACKGROUND OF THE INVENTION

There is a continuing desire in the microelectronics industry to increase the circuit density in multilevel integrated circuit devices, e.g., memory and logic chips, thereby increasing their performance and reducing their cost. In order to accomplish this goal, there is a desire to reduce the minimum feature size on the chip, e.g., circuit linewidth, and also to improve the properties of the interposed layer of dielectric material to lower the dielectric constant and avoid cracking of the dielectric layers during manufacturing of the integrated circuit device.

One prior art dielectric material used in integrated circuit devices is a slurried particulate glass which is coated as a film on a substrate and sintered to form the dielectric layer. Unfortunately, sintering requires very high temperatures which are unsuitable in some applications. A solution of methyl silsesquioxane is sold by Allied Signal Corp. under the trademark AS-418 for use as a dielectric material in microelectronics. A solution of silsesquioxane is also sold by Dow Corning Corp. under the Trademark $FO_x$ for use in microelectronics. However, films of silsesquioxane, especially thicker films of silsesquioxane, have a tendency to crack during manufacturing. There is a continuing need in the art for a low dielectric composition which can be readily formed into film and processed without cracking.

It is therefore an object of the present invention to provide an improved dielectric composition and process for forming the dielectric layers in integrated circuit devices.

Other objects and advantages will be apparent from the following disclosure.

SUMMARY OF THE INVENTION

The present invention relates to a dielectric composition and a process for making an integrated circuit device. The dielectric composition for use in the process of the present invention comprises silsesquioxane preferably methyl silsesquioxane and a photosensitive or thermally sensitive base generator. The integrated circuit device comprises (i) a substrate, (ii) interconnecting metallic circuit lines positioned on the substrate, and (iii) a dielectric material positioned contiguous to the circuit lines (over and/or between the circuit lines). The dielectric material in the integrated circuit device is condensed silsesquioxane network. The process for forming the integrated circuit device involves thermal condensation of a film of dielectric composition of the present invention i.e., low molecular weight silsesquioxane precursor and a photosensitive or thermally sensitive base generator. During the condensation reaction, a base is generated (activated) by light or heat. The generated base catalyzes the condensation reaction thereby enabling extensive condensation of the silsesquioxane network at a lower temperature. The base is not generated until it is desired to condense the silsesquioxane precursor thereby enhancing the shelf life of the composition.

A more thorough disclosure of the present invention is presented in the detailed description which follows and from the accompanying drawing.

DETAILED DESCRIPTION OF THE INVENTION

Figure 1:
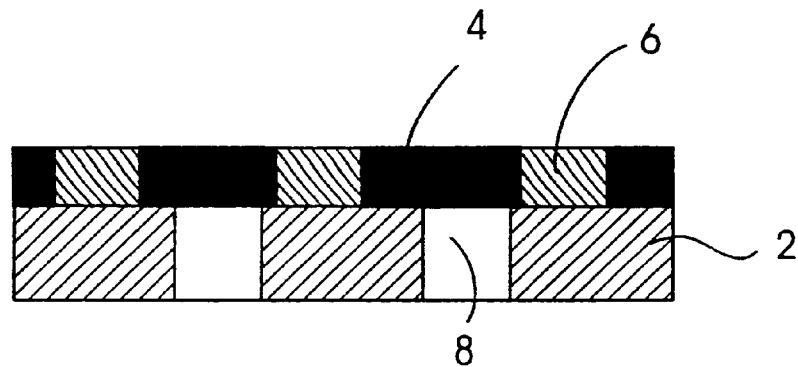
FIG. 1 is a cross-sectional view of a portion of the integrated circuit device of the present invention.

An embodiment of the integrated circuit device made by the process of the present invention is shown in FIG. 1. The device generally comprises substrate 2, metallic circuit lines 4, and dielectric material 6. The substrate 2 has vertical metallic studs 8 formed therein. The circuit lines function to distribute electrical signals in the device and to provide power input to and signal output from the device. Suitable integrated circuit devices will generally comprise multiple layers of circuit lines which are interconnected by vertical metallic studs.

Suitable substrates for the device comprise silicon, silicon-germanium, silicon nitride, and gallium arsenide. Other suitable substrates will be known to those skilled in the art. In a multilayer integrated circuit device, an underlying layer of insulated, planarized circuit lines can also function as a substrate.

Suitable circuit lines generally comprise a metallic, electrically conductive material such as copper, aluminum, tungsten, gold, silver, or alloys thereof. Optionally, the circuit lines may be coated with a metallic liner such as a layer of nickel, tantalum, or chromium, and/or other layers such as barrier or adhesion layers (e.g., SiN, TiN).

The process of the present invention involves forming the dielectric layer which is positioned over the circuit lines and/or between the circuit lines, and on the substrate. In multilevel integrated circuit devices, the dielectric layer is often planarized to function as a substrate layer for lithographic formation of the next layer of circuit lines.

Suitable silsesquioxanes for use as a dielectric in the present invention are known to those skilled in the art. Suitable silsesquioxane for the present invention are unsubstituted or substituted with alkyl (e.g., $C_{1-4}$-alkyl), phenyl or alkyl/phenyl. Preferred silsesquioxane is a alkyl(methyl) phenyl silsesquioxane examples of which are commercially available (e.g., GR650 and 950 from Techniglass, Perrysburg, Ohio). Other suitable silsesquioxanes will be known to those skilled in the art such as disclosed in U.S. Pat. No. 5,384,376 and *Chem. Rev.* 95, 1409–1430 (1995), the disclosures of which are incorporated herein by reference. The silsesquioxane precursor is partially condensed silsesquioxane preferably having a molecular weight $M_N$ of less than 1000. The silsesquioxane can be mixed with tetralkoxysilane e.g., tetraethoxysilane, alkyl/trialkoxy or trihalo silicates or dialkyl/dialkoxy or dihalo silicates.

The photosensitive and thermally sensitive base generators are protected by a protecting group and do not accelerate the condensation reaction until the free base is liberated by cleavage of the protecting group with heat or light. At room temperature the thermal and photosensitive base generators are substantially inert to the silsesquioxane. Preferred photosensitive base generator are photosensitive amine generators. Suitable photosensitive amine generators are urethanes (carbamate derivatives derived from substituted o-nitrobenzyl alcohols and mono or diisocyanates). A suitable photosensitive amine generator is 0-nitrobenzylcarbamate. Another suitable photosensitive amine generator is t-butyl carbamate. Other suitable photosensitive amine generators include benzyl carbamates (e.g., amines protected by a benzyloxycarbonyl substituent), benzyl sulfonamides, benzyl quaternary ammonium salts, imines, iminium salts and cobalt-amine complexes. Suitable photosensitive amine generators are (α-methyl-2-nitrobenzyloxy carbonyl) carbamate of a primary or secondary amine, diamine or polyamine, e.g., bis [α-methyl-2'-nitrobenzyloxy) carbonyl] hexane-1,6-diamine. Suitable photosensitive amine generators have the formula: RR'N—CO—OR" where R and R' are independently hydrido or lower ($C_{1-6}$) alkyl and R" is nitrobenzyl (e.g., ortho) or α methyl nitrobenzyl. Other photosensitive amine generators suitable for use in the present inventions will be known to those skilled in the art such as those disclosed in "Base Catalysis in Imaging Materials", by J. Frechet et al., J. Org. Chem. 1990, 55, 5919; "Acid Hardening Positive Photoresist Using Photochemical Generation of Base" by Winkle et al., J. Of Photopolymer Sci. and Tech. 3, 1990, 419, and "Synthetic Organic Photochemistry" by Horspool, Plenum Press 198 the disclosures of which are incorporated herein by reference. Conveniently, the photosensitive amine generator will absorb light in the 225–500 nm region to generate free amines.

Suitable thermal base generators for use in the present invention are bases which have a thermally removable protecting group. Heating the base to an elevated temperature of about 75° to about 200° C. releases the free base which can then catalyze the condensation reaction. Suitable thermal base generators include carbamates and organic quarternary ammonium salts. Suitable thermally sensitive amine generators include t-butoxycarbamates of primary and secondary amines, diamines and polyamines such as polyalkylene (e.g., $C_2$) imine and amino substituted (i) polyethers, (ii) polystyrenes (iii) polymethacrylates and (iv) polysiloxanes. A suitable thermal amine generator is Bis (t-butoxycarbonyl)-4,7,10 trioxa-1,13-tridecanediamine. Suitable thermal base generators have the formula: RR'N—CO—OR" where R and R" are independently hydrido or lower ($C_{1-6}$) alkyl and R" is t-butyl. Other thermal base generators will be known to those skilled in the art.

Figure 2:
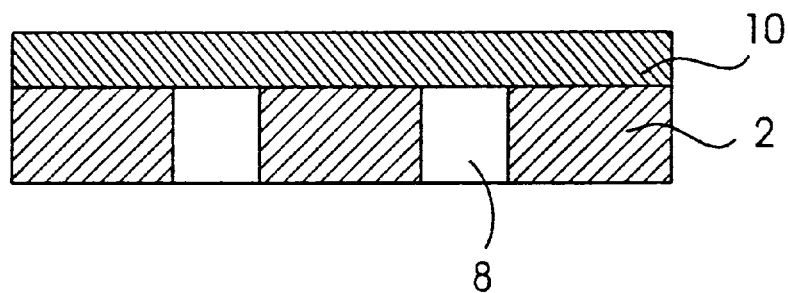
FIGS. 2–5 show a process for making the integrated circuit device of the present invention.

Referring to FIG. 2, the first step of one process embodiment of the present invention involves disposing on a substrate 2 a layer 10 of the dielectric composition of the present invention comprising silsesquioxane precursor and amine generator. The substrate 2 is shown with vertical metallic studs 8. The composition is dissolved in a suitable solvent for both the amine generator and silsesquioxane to form a solution. Suitable solvents include N,N' dimethylpropyleneurea (DMPU), NMP, propylene glycol monomethyl etheracetate, ethyl lactate, ethyl β-methoxypropionate cycloalkanones, γ-butyrolactone or the like. The amine generator concentration will suitably be about 0.1–1.2 mmoles/gram of silsesquioxane. The solution is applied to the subtrate by art-known methods such as spin, dip or spray coating or doctor blading. The solution has a low viscosity at high solids level so that it will planarize the substrate and gap fill. The second step of the process involves heating the composition to an elevated temperature to generate free amine and condense the silyl reactive groups of the silsesquioxane. The free amine base catalyzes the cross-condensation reaction enabling greater cure at a lower temperature. The protected and free amine have high boiling points so that they remain insitu during condensation of the silisesquioxane and are removed by heating upon completion of the condensation reaction.

Figure 3:
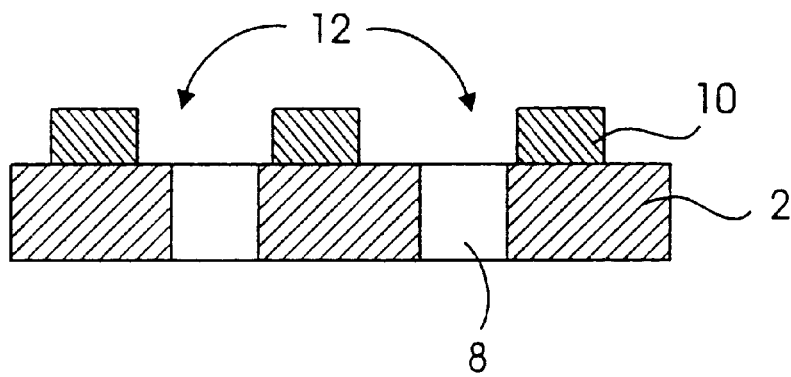

Referring to FIG. 3, the third step of the process involves lithographically patterning the layer 10 of dielectric composition to form trenches 12 (depressions) in the layer of composition. The trenches 12 shown in FIG. 3 extend to the substrate 2 and to the metallic stud 8. Lithographic patterning generally involves (i) coating the layer 10 of dielectric composition with a positive or negative photoresist such as those marketed by Shipley or Hoechst Celanese (AZ photoresist); (ii) imagewise exposing (through a mask) the photoresist to radiation such as electromagnetic, e.g., UV or deep UW; (iii) developing the image in the resist, e.g., with suitable basic developer; and (iv) transferring the image through the layer 10 of dielectric composition to the substrate 2 with a suitable transfer technique such as reactive ion beam etching (RIE). Suitable lithographic patterning techniques are well known to those skilled in the art such as disclosed in Thompson et al., "Introduction to Microlithography" (1994), the disclosure of which is incorporated herein by reference.

Figure 4:
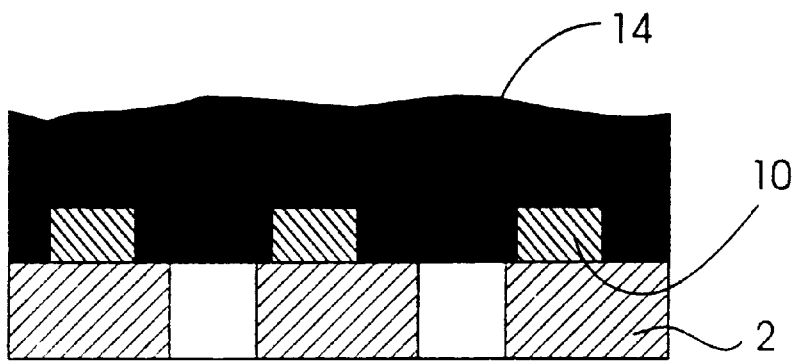

Referring to FIG. 4, in the fourth step of the process for forming the integrated circuit of the present invention, a metallic film 14 is deposited onto the patterned dielectric layer 10. Preferred metallic materials include copper, tungsten, and aluminum or alloys. The metal is suitably deposited onto the patterned dielectric layer by art-known techniques such as chemical vapor deposition (CVD), plasma-enhanced CVD, electro and electroless deposition, sputtering, or the like.

Figure 5:
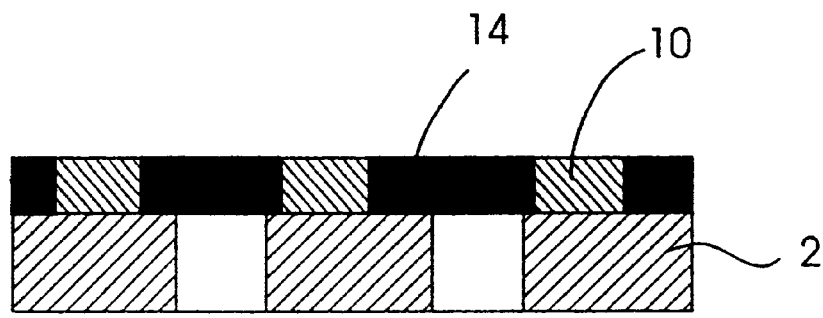

Referring to FIG. 5, the last step of the process involves removal of excess metallic material and planarizing the entire wafer surface so that film 14 is generally level with the patterned dielectric layer 10. This can be accomplished using chemical/mechanical polishing or selective wet or dry etching. Suitable chemical/mechanical polishing methods are known to those skilled in the art.

Figure 6:
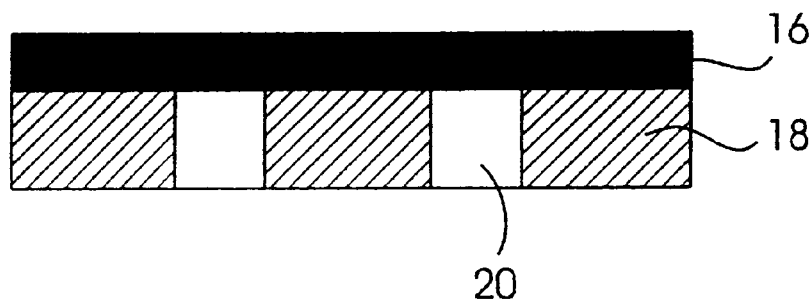
FIGS. 6–8 show an alternative process for making the integrated circuit device of the present invention.
Figure 7:
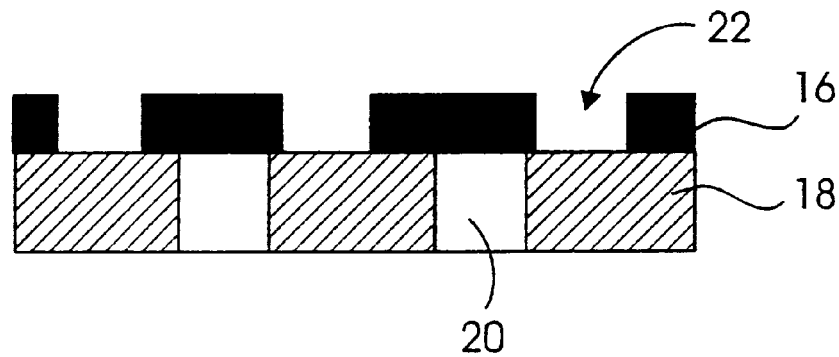
Figure 8:
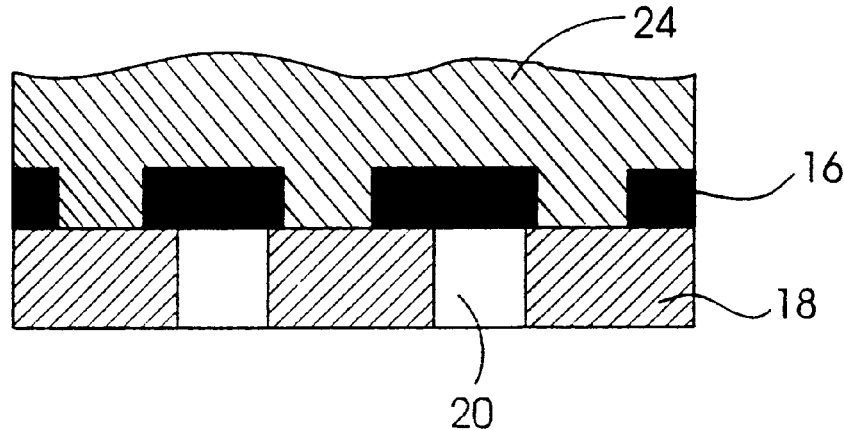

Referring to FIGS. 6–8, there is shown an alternative embodiment of the process of the present invention for making the integrated circuit devices. The first step of the process in this embodiment involves depositing a metallic film 16 onto a substrate 18. Substrate 18 is also provided with vertical metallic studs 20. Referring to FIG. 7, in the second step of the process, the metallic film is lithographically patterned through a mask to form trenches 22. Referring to FIG. 8, in the third step of the process, a layer 24 of dielectric composition of the present invention is deposited onto the patterned metallic film 16. In the last step of the process, the composition is heated to completely condense the silsesquioxane. Optionally, the dielectric layer itself may then be planarized for subsequent processing in a multilayer integrated circuit.

The dielectric composition of the present invention has a dielectric constant less than 3.0, preferably less than 2.5 at 80° C. The composition has enhanced mechanical toughness and polishing characteristics enhanced thermal stability and enhanced dielectric properties. Further, the dielectric composition has enhanced mechanical properties that resist cracking even for thick films (e.g., thickness of greater than 1.0 micron) in high ambient humidity. The composition can be chemically/mechanically planarized to facilitate lithographic formation of additional circuit levels in multilevel integrated circuit devices. The dielectric composition adheres well to the substrate. The dielectric composition undergoes minimal shrinkage during heating.

The composition of the present invention can also be utilized to fabricate a patterned dielectric layer to enable circuit formation therein to form a conducting layer in a multichip module. Patterned exposure of the dielectric layer with photosensitive base generators will cause condensation of the exposed areas. Development with a casting solvent will result in the patterned dielectric layer.

Although this invention has been described with respect to specific embodiments, the details thereof are not to be construed as limitations for it will be apparent that various embodiments, changes, and modifications may be resorted to without departing from the spirit and scope thereof, and it is understood that such equivalent embodiments are intended to be included within the scope of this invention.

What is claimed is:

1. A process for forming an integrated circuit device comprising:
   (a) positioning a layer of a dielectric composition comprising a silsesquioxane and a photosensitive amine generator, said amine generator selected from the group consisting of carbamate derivatives derived from substituted o-nitrobenzyl alcohols and mono- or diisocyanates urethanes, benzyl carbamates, benzyl sulfonamides, benzyl quaternary ammonium salts, imines, iminium salts, cobalt-amine complexes, (α-methyl-2-nitrobenzyloxycarbonyl) carbamates of primary or secondary amines, diamines or polyamines and compounds having the formula RR'—N—COOR", where R and R' are independently hydrido or $C_1$–$C_6$ alkyl and R" is nitrobenzyl or α-methylnitrobenzyl, on a substrate;
   (b) generating amine from said photosensitive amine generator;
   (c) heating said dielectric composition to react said silsesquioxane whereby a dielectric layer is formed on said substrate;
   (d) lithographically patterning said dielectric layer;
   (e) depositing a metallic film onto said patterned dielectric layer; and
   (f) planarizing said metallic film to form an integrated circuit.

2. A process in accordance with claim 1 wherein said silsesquioxane is $C_1$–$C_4$ alkyl silsesquioxane or $C_1$–$C_4$ alkyl/phenyl silsesquioxane.

3. A process in accordance with claim 1 wherein said urethane is a carbamate derived from a substituted o-nitrobenzyl alcohol and a mono- or diisocyanate.

4. A process in accordance with claim 1 wherein said photosensitive amine generator is o-nitrobenzyl carbamate.

5. A process for forming an integrated circuit comprising:
   (a) depositing a metallic film on a substrate;
   (b) lithographically patterning said metallic film;
   (c) depositing a layer of a dielectric composition comprising a silsesquioxane and a photosensitive amine generator, said amine generator selected from the group consisting of urethanes, benzyl carbamates, benzyl sulfonamides, benzyl quaternary ammonium salts, imines, iminium salts, cobalt-amine complexes, (α-methyl-2-nitrobenzylcarbonyl) carbamates of primary or secondary amines, diamines or polyamines and compounds having the formula RR'—N—COOR", where R and R' hare independently hydrido or $C_1$–$C_6$ alkyl and R" is nitrobenzyl or α-methylnitrobenzyl, on said patterned metallic film;
   (d) generating amine from said photosensitive amine generator; and
   (e) heating said dielectric composition to react said silsesquioxane whereby a dielectric layer is formed on said metallic film.

6. A process in accordance with claim 5 wherein said silsesquioxane is $C_1$–$C_4$ alkyl silsesquioxane or $C_1$–$C_4$ alkyl/phenol silsesquioxane.

7. A process in accordance with claim 5 wherein said base generator is a thermal base generator selected from the group consisting of carbamates and organic quaternary ammonium salts.

8. A process in accordance with claim 5 wherein said urethane is a carbamate derived from a substituted o-nitrobenzyl alcohol and a mono- or diisocyanate.

9. A process in accordance with claim 5 wherein said photosensitive amine generator is o-nitrobenzyl carbamate.

10. A process for forming an integrated circuit device comprising:
    (a) positioning a layer of a dielectric composition comprising a silsesquioxane and a thermal amine generator, said thermal amine generator selected from the group consisting of carbamates, organic quaternary ammonium salts and a compound having the structural formula RR'N—COOR", where R and R' are independently hydrido or $C_1$–$C_6$ alkyl and R" is t-butyl, on a substrate;
    (b) generating amine from said thermal amine generator;
    (c) heating said dielectric composition to react said silsesquioxane whereby a dielectric layer is formed on said substrate;
    (d) lithographically patterning said dielectric layer;
    (e) depositing a metallic film onto said patterned dielectric layer; and
    (f) planarizing said metallic film to form an integrated circuit.

11. A process in accordance with claim 10 wherein said thermal amine generator is a t-butoxycarbamate of a primary or secondary amine, diamine or polyamine.

12. A process in accordance with claim 11 wherein said t-butoxycarbamate is selected from the group consisting of polyalkylene imine- or amino-substituted polyethers, polystyrenes, polymethacrylates and polysiloxanes.

13. A process in accordance with claim 12 wherein said t-butoxycarbamate is bis(t-butoxycarbonyl)-4,7,10-trioxa-1,13-tridecanediamine.

14. A process for forming an integrated circuit device comprising:
    (a) depositing a metallic film on a substrate;
    (b) lithographically patterning said metallic film;
    (c) depositing a layer of dielectric composition comprising a silsesquioxane and a thermal amine generator, said thermal amine generator selected from the group consisting of carbamates, organic quaternary ammonium salts and a compound having the structural formula RR'N—COOR", where R and R' are independently hydrido or $C_1$–$C_6$ alkyl and R" is t-butyl, on a substrate;
    (d) generating amine from said thermal amine generator; and
    (e) heating said dielectric composition to react said silsesquioxane whereby a dielectric layer is formed on said metallic film.

15. A process in accordance with claim 14 wherein said thermal amine generator is a t-butoxycarbamate of a primary or secondary amine, diamine or polyamine.

16. A process in accordance with claim 15 wherein said t-butoxycarbamate is selected from the group consisting of polyalkylene imine- or amino-substituted polyethers, polystyrenes, polymethacrylates and polysiloxanes.

17. A process in accordance with claim 16 wherein said t-butoxycarbamate is bis(t-butoxycarbonyl)-4,7,10-trioxa-1,13-tridecanediamine.

* * * * *